(12) United States Patent
Iadanza et al.

(10) Patent No.: US 11,601,118 B1
(45) Date of Patent: Mar. 7, 2023

(54) LATCH DEVICE AND OPERATION METHOD THEREOF

(71) Applicant: NANYA TECHNOLOGY CORPORATION, New Taipei (TW)

(72) Inventors: Joseph Iadanza, New Taipei (TW); Lamiaa Msalka, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/542,511

(22) Filed: Dec. 6, 2021

(51) Int. Cl.
*H03K 3/037* (2006.01)

(52) U.S. Cl.
CPC .................. *H03K 3/0375* (2013.01)

(58) Field of Classification Search
CPC .................................................. H03K 3/0375
See application file for complete search history.

(56) References Cited

U.S. PATENT DOCUMENTS

| | | | | |
|---|---|---|---|---|
| 8,487,802 B2 * | 7/2013 | Naka | ....................... | H03K 5/249 |
| | | | | 341/158 |
| 8,742,796 B2 * | 6/2014 | Dally | ..................... | H03K 3/012 |
| | | | | 327/51 |
| 2016/0322962 A1 | 11/2016 | Hsu et al. | | |
| 2018/0115306 A1 * | 4/2018 | Saha | ....................... | H03K 3/012 |
| 2019/0173440 A1 * | 6/2019 | Rasmus | .............. | H03F 3/45771 |
| 2020/0204184 A1 * | 6/2020 | Rattan | ..................... | H03M 1/38 |

OTHER PUBLICATIONS

"Office Action of Taiwan Counterpart Application", dated Aug. 2, 2022, p. 1-p. 7.

* cited by examiner

*Primary Examiner* — Sibin Chen
(74) *Attorney, Agent, or Firm* — JCIPRNET

(57) ABSTRACT

A latch device includes a differential pair, a differential circuit, and a clock gate circuit. The differential pair receives differential input signals, and the differential circuit performs a logic operation on the differential input signals. The clock gate circuit is configured to supply a supply voltage from the power supply node to the first connection node according to a clock signal. The clock gate circuit includes a reference-independent circuit and a reference-dependent circuit. The reference-independent circuit is configured to control a first electrical path between the power supply node and the first connection node according to the clock signal. The reference-dependent circuit is configured to control a second electrical path between the power supply node and the first connection node according to the clock signal and a first control signal, wherein the first control signal is determined according to a voltage level of one of the differential input signals.

18 Claims, 4 Drawing Sheets

LATCH DEVICE AND OPERATION METHOD THEREOF

BACKGROUND

Technical Field

The disclosure relates to a latch device, and more particularly to an operation method and a latch device and that are capable of operating in a wide common-mode range of differential input signals.

Description of Related Art

A latch device such as a differential cascode voltage switch (DCVS) latch is commonly used in systems due to their high speed, low power and noise immunity. In some systems, the common-mode input voltages being supplied to the DCVS latch are tunable within a wide percentage of a supply voltage, resulting in a wide variation of a headroom voltage available between the source and the gate of the differential pair transistors in the DCVS latch. The wide range of a headroom voltage caused by the wide range of the common-mode input voltage may result in many issues related to the overall size, power consumption and performance of the DCVS latch.

As the latch device in different systems may operate in different ranges of common-mode input voltage, it is expected that the latch device is capable of operating over a wide range of common mode input voltages. Nothing herein should be construed as an admission of knowledge in the prior art of any portion of the present disclosure.

SUMMARY

The disclosure introduces an operation method and a latch device that may operate reliably over a wide common-mode range of differential input signals.

In some embodiments, the latch device includes a differential pair, a differential circuit, and a clock gate circuit. The differential pair is configured to receive differential input signals. The differential circuit includes a pair of cross-coupled inverters and is configured to perform a logic operation on the differential input signals. The clock gate circuit is coupled between a power supply node and a first connection node and is configured to provide a supply voltage from the power supply node to the first connection node according to a clock signal. The clock gate circuit includes a reference-independent circuit and a reference-dependent circuit, in which the reference-independent circuit is configured to control a first electrical path between the power supply node and the first connection node according to the clock signal. The reference-dependent circuit is configured to control a second electrical path between the power supply node and the first connection node according to the clock signal and a first control signal, wherein the first control signal is determined according to a voltage level of one of the differential input signals.

In some embodiments, the latch device includes a differential pair, a differential circuit and an offset cancellation circuitry. The differential pair is configured to receive differential input signals. The differential circuit includes a pair of cross-coupled inverters and is configured to perform a logic operation on the differential input signals. The offset cancellation circuitry includes at least one first offset cancellation circuit and at least one second offset cancellation circuit. The at least one first offset cancellation circuit is coupled between a first connection node and a second connection node, and the at least one second offset cancellation circuit is coupled between the first connection node and a third connection node. Each of the at least one first offset cancellation circuit and the at least one second offset cancellation circuit includes a reference-independent circuit and a reference-dependent circuit. The reference-independent circuit is configured to control a first electrical path between the first connection node and one of the second connection node and the third connection node according to an offset control bit. The reference-dependent circuit is configured to control a second electrical path between the first connection node and the one of the second connection node and the third connection node according to the offset control bit and a first control signal, wherein the first control signal is determined according to a voltage level of one of the of the differential input signals.

In some embodiments, the operation method of the latch device includes steps of receiving, by a differential pair of the latch device, differential input signals; controlling, by a first reference-independent circuit included in a clock gate circuit of the latch device, a first electrical path between a power supply node and a first connection node according to a clock signal; and controlling, by a first reference-dependent circuit included in the clock gate circuit of the latch device, a second electrical path between the power supply node and the first connection node according to the clock signal and a first control signal, wherein the first control signal is determined according to a voltage level of one of the differential input signals.

In accordance with embodiments of the disclosure, as each of the clock gate circuit and the offset cancellation circuitry may include a reference-independent circuit and a reference-dependent circuit, the clock gate circuit and the offset cancellation circuitry may adjust the effective conductive widths of the clock gate circuit and the offset cancellation circuitry according to the voltage level of at least one of the differential input signals INP and INN. In this way, the latch device 100 may operate in a wide common-mode range of the differential input signals.

DESCRIPTION OF THE EMBODIMENTS

Figure 1:
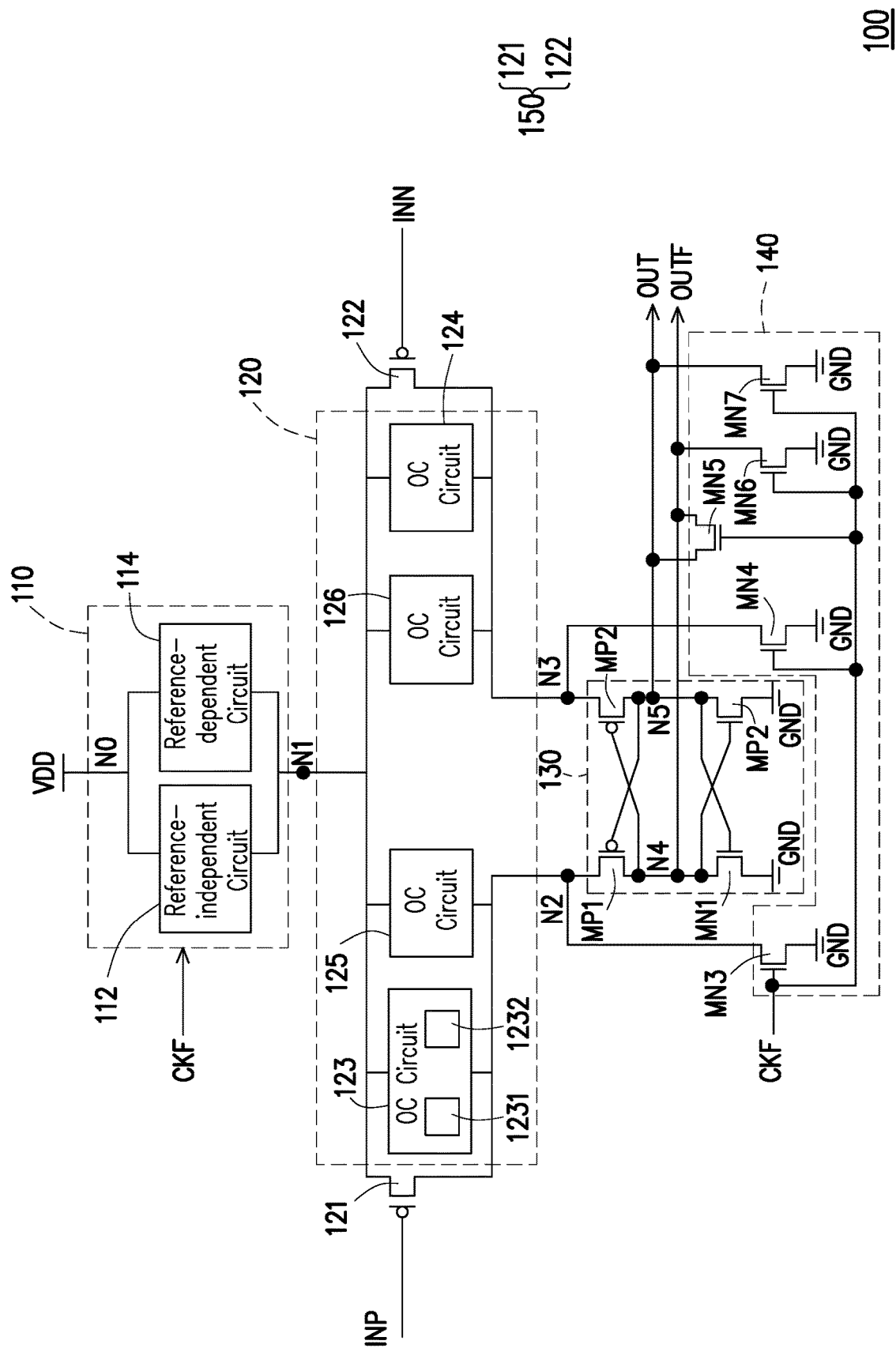
FIG. 1 illustrates a schematic diagram of a latch device in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a latch device 100 in accordance with some embodiments. The latch device 100 may include a clock gate circuit 110, an offset cancellation (OC) circuitry 120, a differential circuit 130, a reset circuit 140 and a differential pair 150. Furthermore, the latch device 100 may include a power supply node N0 and a plurality of connection nodes N1 through N5. The power supply node N0 receives the power supply voltage VDD; the connection node N1 is coupled to the clock gate circuit 110, the OC circuitry 120 and the differential pair 150; the connections nodes N2 and N3 are coupled to the OC circuitry 120, the differential pair 150 and the differential circuit 130. In some embodiments, differential pair 150 includes transistors 121 and 122, wherein the control terminals of the transistors 121 and 122 receive the input signals INP and INN, respectively. It is noted that the disclosure does not intend to limit the types of the input signals INP and INN. For example, in an embodiment, the input signals INP and INN are differential input signals. In an alternative embodiment, one of the input signals INP or INN is a differential input signal, and the other one of the input signals INP or INN is a reference signal. For simplicity, the input signal INN will be referred to as the reference signal, regardless of the type of the input signals INP and INN. It is noted that various modifications and changes are possible within the scope of the disclosure. For example, the disclosure should not be limited to the case where VDD is the power source for the clock gate circuit 110. The whole structure of the latch device 100 may be flipped upside down where VDD connections become GND connections and vice versa. If the circuit was flipped, control polarities would also flip.

The clock gate circuit 110 may include a reference-independent circuit 112 and a reference-dependent circuit 124 that are configured to effect the conductive width of the clock gate circuit 110 by controlling the formation of electrical paths between the power supply node N0 and the connection node N1. The effective conductive width of the clock gate circuit 110 increases as more electrical paths are formed between the power supply node N0 and the connection node N1; and the effective conductive width of the clock gate circuit 110 decreases as less electrical paths are formed between the power supply node N0 and the connection node N1. In some embodiments, the reference-independent circuit 112 is configured to control the formation of the electrical paths between the power supply node N0 and the connection node N1 independently from a voltage level of the reference signal INN; and the reference-dependent circuit 114 is configured to control the formation of the electrical paths between the power supply node N0 and the connection node N1 based on the voltage level of the reference signal INN. For example, the reference-independent circuit 112 may control the formation of the electrical paths between the power supply node N0 and the connection node N1 based on a clock signal CKF which is independent from the voltage level of the reference signal INN. The reference-dependent circuit 114 may control the formation of the electrical paths between the power supply node N0 and the connection node N1 based on both clock signal CKF and a control signal, where the value of the control signal is determined according to the voltage level of the reference signal INN. The detailed structure of the clock gate circuit 110 in accordance with some embodiments are illustrated in FIG. 2.

Figure 2:
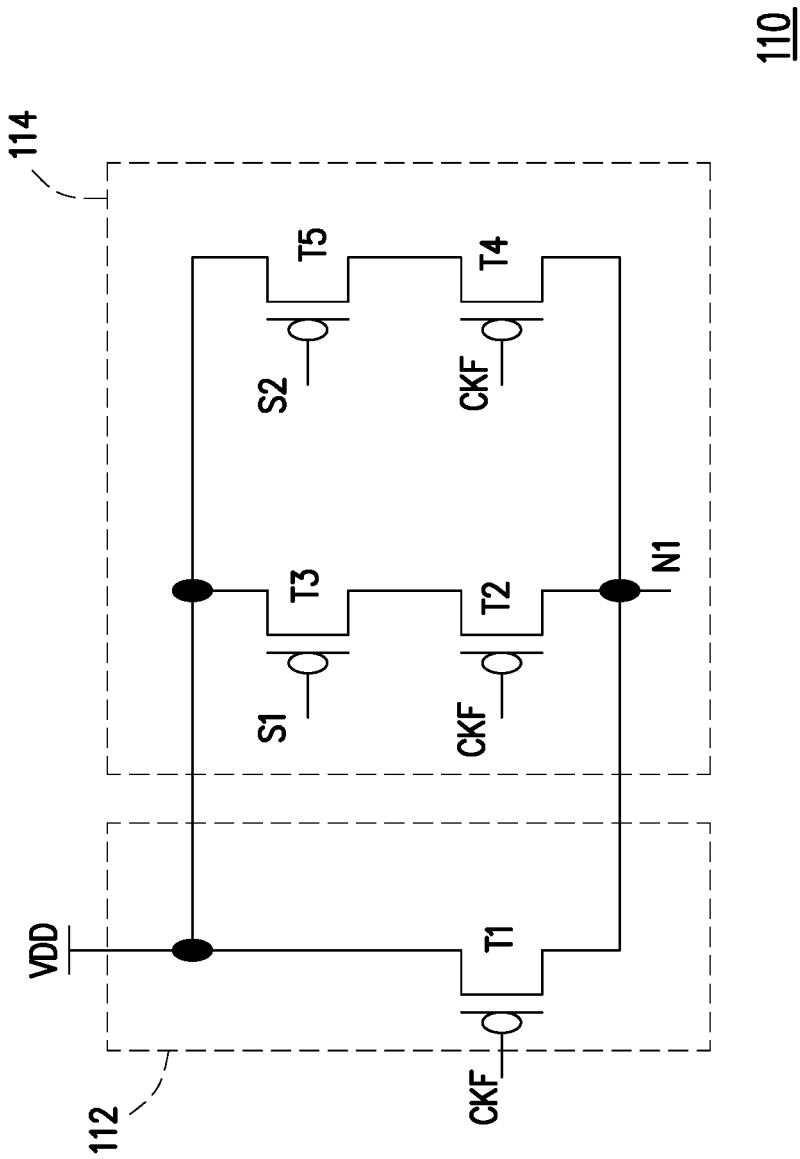
FIG. 2 illustrates a schematic diagram of a clock gate circuit of a latch device in accordance with some embodiments.

Referring to FIG. 2, the reference-independent circuit 112 includes a transistor T1 coupled between the power supply node N0 and the connection node N1, wherein the transistor T1 is controlled by the clock signal CKF. The reference-dependent circuit 114 includes transistors T2 and T3 coupled in series between the power supply node N0 and the connection node N1. The transistor T2 is controlled by the clock signal CKF, and the transistor T2 is controlled by a control signal S1. In some embodiments, the clock signal CKF is independent from the voltage level of the reference signal INN, and the control signal S1 is dependent on the voltage level of the reference signal INN. In this way, the reference-dependent circuit 114 may control the formation of the electrical paths between the power supply node N0 and the connection node N1 based on the voltage level of the reference signal INN.

The reference-dependent circuit 114 may further includes transistor T4 and T5 coupled in series between the power supply node N0 and the connection node N1. The transistor T4 is controlled by the clock signal CKF, and the transistor T5 is controlled by a control signal S2 which is dependent on the voltage level of the reference signal INN. Since the control signals S1 and S2 are determined according to the voltage level of the reference signal INN, the reference-dependent circuit 114 may control the formation of the electrical paths between the power supply node N0 and the connection node N1 based on the voltage level of the reference signal INN. It is noted that the disclosure does not intend to limit the number of electrical paths or the number of transistors included in the reference-dependent circuit 114.

In some embodiments, the values of the control signals S1 and S2 are determined according to comparisons of the voltage level of the reference signal INN to threshold values. For example, the value of the control signal S1 may be determined according comparison of the voltage level of the reference signal INN and a first threshold value. The control signal S1 may be set to a first logic state (i.e., logic state "0") when the voltage level of the reference signal INN is above the first threshold value; and the control signal S1 may be set to a second logic state (i.e., logic state "1") when the voltage level of the reference signal INN is below the first threshold value. The logic value of the control signal S2 may be determined according to the comparison of the voltage level of the reference signal INN and a second threshold value that is greater than the first threshold value. The control signal S2 may be set to the first logic state (i.e., logic state "0") when the voltage level of the reference signal INN is above the second threshold value; and the control signal S2 is in the second logic state (i.e., logic state "1") when the voltage level of the reference signal INN is below the second threshold value.

In some embodiments, the headroom voltage (i.e., the gate-source voltage) of the transistors 121 and 122 in the differential pair 150 is negatively proportional to the voltage levels of the input signals INP and INN. For example, as the voltage level of the reference signal INN is lower, the headroom voltage of the differential pair 150 is higher, and vice versa. In some embodiments, when the voltage level of the reference signal INN is relatively low and the headroom voltage of the transistors in the differential pair is relatively high, the clock gate circuit 110 controls the reference-dependent circuit 114 using the control signals S1 and S2 to form less electrical paths between the power supply node N0 and the connection node N1. For example, when the voltage level of the reference signal INN is below the first threshold voltage, control signals S1 and S2 are both at the logic state "1", and the reference-dependent circuit 114 does not form electrical paths between the power supply node N0 and the connection node N1. In another example, when the voltage level of the reference signal INN is above the first threshold value but below the second threshold value, the control signal S1 has the logic state "0" and the control signal S2 has the logic state "1", and the reference-dependent circuit 114 forms an electrical path between the power supply node N0 and the connection node N1 through transistors T2 and T3.

As such, when the voltage level of the reference signal INN is relatively low, the effective conductive width of the clock gate circuit 110 is reduced, less power is supplied to the latch device 100, and the latch device 100 is not over-powered. In addition, as the clock gate circuit 110 controls the reference-dependent circuit 114 to form less electrical paths between the power supply node N0 and the connection node N1, the reference-dependent offsets are reduced. The reference dependent offsets may be caused when the differential pair 150 has high headroom and is overpowered by the clock gate circuit 110.

When the voltage level of the reference signal INN is relatively high and the headroom voltage of the differential pair is relatively low, the clock gate circuit 110 controls the reference-dependent circuit 114 using the control signals S1 and S2 to form more electrical paths between the power supply node N0 and the connection node N1. For example, when the voltage level of the reference signal INN is above both the first threshold value and the second threshold value, both the control signals S1 and S2 have the logic state "0", and the reference-dependent circuit 114 forms electrical paths between the power supply node N0 and the connection node N1 through transistors T2 and T3 and transistors T4 and T5. As such, the effective conductive width of the clock gate circuit 110 is increased, and more power is supplied to the latch device 100 to counter loss of the headroom voltage. As a result, the latch device 100 can operate reliably with a wide common-mode range of the input signals, and the performance of the latch device 100 is improved.

It is appreciated that the disclosure does not intend to limit the number of transistors, the number of control signals, the number of electrical paths, and the types of the transistors in the clock gate circuit 110. The first threshold value and the second threshold value may be pre-determined value that is pre-stored in a register being included in the latch device 100 or being located outside of the latch device 100. In addition, the control signals S1 and S2 may be generated by a controller (not shown) that is located inside or outside the latch device 100.

Returning to FIG. 1, in some embodiments, the OC circuitry 120 may include left-side OC circuits 123 and 125 and right-side OC circuits 124 and 126, wherein the left-side OC circuits 123 and 125 are coupled between the first connection node N1 and the second connection node N2, and the right-side OC circuits 124 and 126 are coupled between the first connection node N1 and the third connection node N3. In some embodiments, the OC circuitry 120 is coupled to the differential pair 150 and is configured to cancel offsets coming from the differential pair 150. The offsets can be caused by different factors such as mismatches of the transistors 121 and 122, mismatches of electronic elements included in the latch device 100, or variations during manufacturing of the differential pair 150. The OC circuitry 120 may selectively control the left-side OC circuits 123 and 125 and the right-side OC circuits 124 and 126, so as to cancel the offsets.

In some embodiments, each of the left-side OC circuits 123 and 125 and the right-side OC circuits 124 and 126 includes a reference-independent circuit and a reference-dependent circuit. The reference-independent circuit may operate independently from the voltage level of the reference signal INN, while operations of the reference-dependent circuit depend on the voltage level of the reference signal INN. For example, the OC circuit 123 includes the reference-independent circuit 1231 and the reference-dependent circuit 1232, where the reference-independent circuit 1231 operates independently from the voltage level of the reference signal INN and operations of the reference-dependent circuit 1232 depend on the voltage level of the reference signal INN. The detailed structure of the OC circuitry 120 in accordance with some embodiments is illustrated in FIG. 3.

Figure 3:
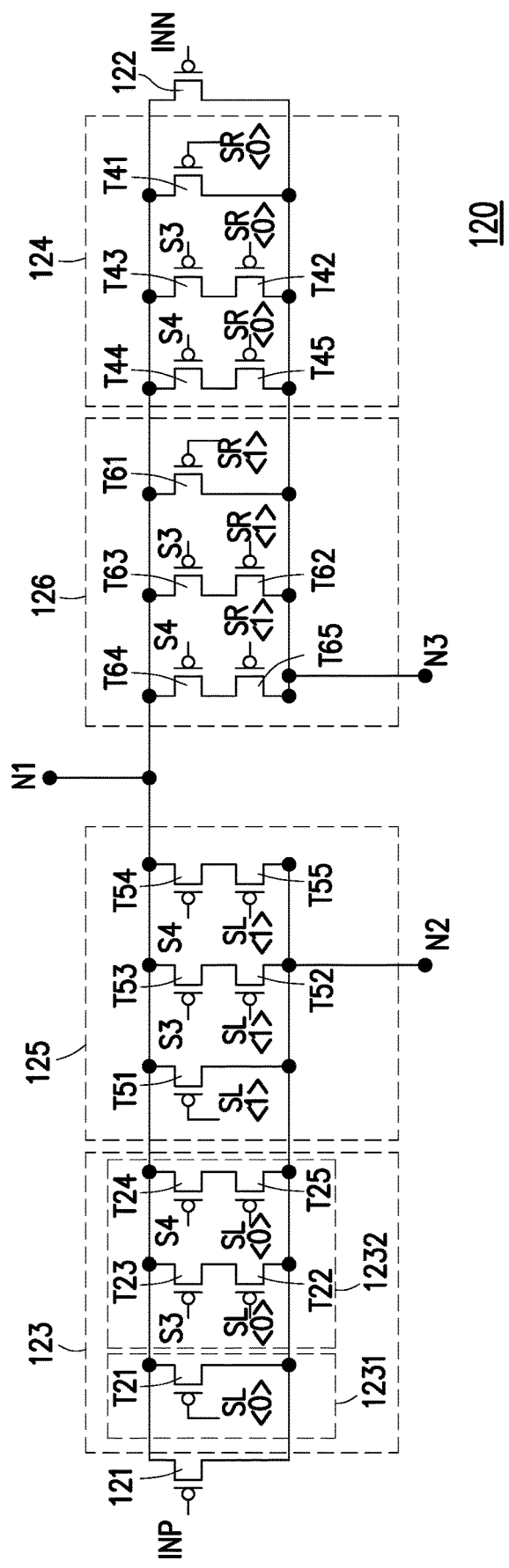
FIG. 3 illustrates a schematic diagram of a differential pair and an offset cancellation circuitry of a latch device in accordance with some embodiments.

Referring to FIG. 3, the reference-independent circuit 1231 may include a transistor T21 that is coupled between the connection nodes N1 and N2 and is controlled by an offset control bit SL<0>, in which the offset control bit SL<0> is independent from the voltage level of the reference signal INN. The reference-independent circuit 1232 may include transistors T22 and T23 coupled in series between the connection nodes N1 and N2. The transistor T22 is controlled by the offset control bit SL<0>; and the transistor T23 is controlled by a control signal S3 which is dependent on the voltage level of the reference signal INN. The reference-dependent circuit 1232 may form an electrical path between the connection node N1 and the connection node N2 based on the clock signal CKF and the control signal S1.

The reference-dependent circuit 1232 may further includes transistor T24 and T25 coupled in series between the connection node N1 and the connection node N2. The transistor T24 is controlled by the offset control bit SL<0>, and the transistor T25 is controlled by a control signal S4 which is dependent on the voltage level of the reference signal INN. In this way, the reference-dependent circuit 1232 may control the formation of electrical paths between the power supply node N0 and the connection node N1 based on the offset control bit SL<0> and the control signals S3 and S4. The disclosure does not intend to limit the number of electrical paths or the number of transistors included in the reference-dependent circuit 1232 of the OC circuit 123.

The OC circuits 124, 125, 126 may have a similar circuit structure as that of the OC circuit 123, thus the detailed description about the circuit structures of the OC circuits 124, 125, 126 are omitted hereafter. A difference between the OC circuit 123 and the OC circuits 124, 125, 126 is the control signals that are asserted to control terminals of the transistors in each of the OC circuits. In the OC circuit 125, the transistors T51, T52 and T54 of the OC circuit 125 are controlled by an offset control bit SL<1>; and the transistors T53 and T55 of the OC circuit 125 are controlled by the control signals S3 and S4, respectively. In the OC circuit 124, the transistors T41, T42 and T44 of the OC circuit 125 are controlled by an offset control bit SR<0>; and the transistors T43 and T45 of the OC circuit 124 are controlled by the control signals S3 and S4, respectively. In the OC circuit 126, the transistors T61, T62 and T64 of the OC circuit 126 are controlled by an offset control bit SR<1>; and the transistors T63 and T65 of the OC circuit 126 are controlled by the control signals S3 and S4, respectively. In some embodiments, the offset control bits SL<0> and SL<1> are two bits in digital signal which is independent from the voltage level of the reference signal INN; and the offset control bits SR<0> and SR<1> are two bits in digital signal which is independent from the voltage level of the reference signal INN. The OC circuits 123, 124, 125 and 125 may also differ in the size of the transistors chosen to make the electrical connections. For instance, the transistors in the OC circuit 123 may have equivalent sizes as the transistors in the OC circuit 124; and the transistors in the OC circuit 125 may have equivalent sizes as the transistors in the OC circuit 126. The sizes of the transistors in the OC circuits 123 and 124 may be different from the sizes of the transistors in the OC circuits 125 and 126. Transistor sizing can implement binary weighting, equal weighting or any other weighting between the OC circuits 123,124 and the OC circuits 125, 126.

In some embodiments, the values of the control signals S3 and S4 are determined according to comparisons of the voltage level of the reference signal INN and threshold values. For example, the value of the control signal S3 is determined according comparison of the voltage level of the reference signal INN and a third threshold value. The control signal S3 may be set to the first logic state (i.e., logic state "0") when the voltage level of the reference signal INN is below the third threshold value; and the control signal S3 is set to the second logic state (i.e., logic state "1") when the voltage level of the reference signal INN is above the third threshold value. Similarly, the logic value of the control signal S4 is determined according comparison of the voltage level of the reference signal INN and a fourth threshold value that is above the third threshold value. The control signal S4 may be set to the first logic state (i.e., logic state "0") when the voltage level of the reference signal INN is below the fourth threshold value; and the control signal S4 is set to the second logic state (i.e., logic state "1") when the voltage level of the reference signal INN is above the fourth threshold value. In some embodiments, the third threshold value is same as the first threshold value and the second threshold value is same as the fourth threshold value, but the disclosure is not limited thereto. In these embodiments, the control signals S3 and S4 are inverted signals of the control signal S1 and S2, respectively.

In some embodiments, when the voltage level of the reference signal INN is relatively low and the headroom voltage of the transistors in the differential pair is relatively high, the OC circuitry 120 controls the reference-dependent circuit 1232 using the control signals S3 and S4 to form more electrical paths between the connection node N1 and the connection node N2. For example, when the voltage level of the reference signal INN is below the third threshold voltage, both the control signals S3 and S4 have the logic state "0", and the reference-dependent circuit 1232 forms electrical paths between the connection nodes N1 and N2 through transistors T22 and T23 and transistors T24 and T25. As a result, the effective conductive width of the OC circuit 123 is increased, and the OC circuitry 120 may perform the offset cancellation operation reliably when the voltage level of the reference signal INN is relatively low.

When the voltage level of the reference signal INN is relatively high and the headroom voltage of the differential pair is relatively low, the OC circuitry 120 controls the reference-dependent circuit 1232 using the control signals S3 and S4 to form less electrical paths between the connection node N1 and the connection node N2. For example, when the voltage level of the reference signal INN is above both the third threshold voltage and the fourth threshold voltage, both the control signals S3 and S4 have the logic state "1", and the reference-dependent circuit 1232 does not form the electrical path between the connection node N1 and the connection node N2. As such, when the voltage level of the reference signal INN is relatively high, the effective conductive width of the reference-dependent circuit 1232 is reduced to correspond with decreasing conduction in the differential pair 150 due to the loss of the headroom voltage. As a result, the OC circuitry 120 may operates well within the wide common-mode range of the input signals.

The operations of the OC circuits 124, 125, 126 could be deduced similarly as the operation of the OC circuit 123 described above, thus the operations of the OC circuits 124, 125, 126 are omitted hereafter. It is appreciated that the disclosure does not intend to limit the number of transistors, the number of control signals, the number of electrical paths, and the types of the transistors in the OC circuitry 120. In addition, the control signals S3 and S4 may be generated by a controller (not shown) that is located inside or outside the latch device 100.

Returning to FIG. 1, the differential circuit 130 may include cross-coupled inverters that are formed by transistors MP1, MP2, MN1 and MN2. The transistors MP1 and MP2 form one of the cross-coupled inverters, and the transistors MP1 and MP2 form another one of the cross-coupled inverters. The differential circuit 130 may further include connection nodes N4 and N5 which serve as the output terminals of the latch device 100. The connection node N4 is coupled between the transistors MP1 and MN1, and the connection node N5 is coupled between the transistors MP2 and MN2.

In some embodiments, the differential circuit 130 is coupled to the differential pair 150 through the connection nodes N2 and N3 to receive signals outputted from the differential pair 150. The differential circuit 130 is configured to perform a logic operation on the signals outputted from the differential pair 150 to generate output signals OUT and OUTF at the connection nodes N4 and N5, respectively. The output signals OUT and OUTF from the connection nodes N4 and N5 are the output signals of the latch device 100. In some embodiments, the output signals OUT and OUTF are differential signals when the input signals INP and INN are differential signals. It is appreciated that the types of the input signals INP and INN and the types of the output signals OUT and OUTF are not limited in the disclosure. Even the transistors MP1 and MP2 are illustrated in FIG. 1 as the p-type transistors and the transistors MN1 and MN2 are illustrated in FIG. 1 as n-type transistors, the disclosure does not intend to limit the types of the transistors MP1, MP2, MN1 and MN2.

In some embodiments, the reset circuit 154 includes a plurality of transistors MN3 through MN7 that are coupled to the connection nodes N2 through N5. The reset circuit 140 is configured to reset the connection nodes N2 through N5 to a reference voltage level (i.e., ground level) in a preset phase of the latch device 100. Particularly, the transistors MN3 and MN4 are coupled to the connection nodes N2 and N3 respectively, and are configured to reset the connection nodes N2 and N3 to the reference voltage level according to the clock signal CKF. The transistors MN6 and MN7 are coupled to the connection nodes N4 and N5 respectively, and are configured to reset the connection nodes N4 and N5 to the reference voltage level according to the clock signal CKF. The transistor MN5 is coupled to between the connection node N4 and the connection node N5, and is configured to electrically connect the connection nodes N4 and N5 according to the clock signal CKF.

In some embodiments, the latch device 100 may operate in the preset phase and a set phase. During the preset phase, the clock signal CKF is in the high logic state (i.e., logic state "1"), the transistors MN3 through MN7 in the reset circuit 140 are turned on to reset the connection nodes N2 through N5 to the reference voltage level. Meanwhile, the clock gate circuit 110 is configured to electrically isolate the power supply node N0 from the connection node N1.

In a set phase, the clock signal CKF is in the low logic state (i.e., logic state "0"), the transistors MN3 through MN7 in the reset circuit 140 are turned off to isolate the connection nodes N2 through N5 from the ground node GND. Meanwhile, the clock gate circuit 110 is configured to electrically connect the power supply node N0 to the connection node N1. Referring to FIG. 1 and FIG. 2, the clock gate circuit 110 may control the formation of the electrical paths between the power supply node N0 and the connection node N1 according to the clock signal CKF and the control signals S1, S2. As the control signals S1 and S2 are determined according to the voltage level of the reference signal INN, the effective conductive width of the clock gate circuit 110 is adjusted according to the voltage level of the reference signal INN. When the input signals INP and INN are asserted to the transistors 121 and 122 of the differential pair 150, a current may flow from the power supply node N0 to the connection node N1 and through the differential pair 150 to the connection nodes N2 and N3. The difference of the input signals INP and INN causes connection nodes N2 and N3 to charge at different rates. When the current difference at the connection nodes N2 and N3 is large enough, the differential circuit 130 performs a latch operation to drive the output signals OUT and OUTF to the output terminals of the latch device 100.

Figure 4:
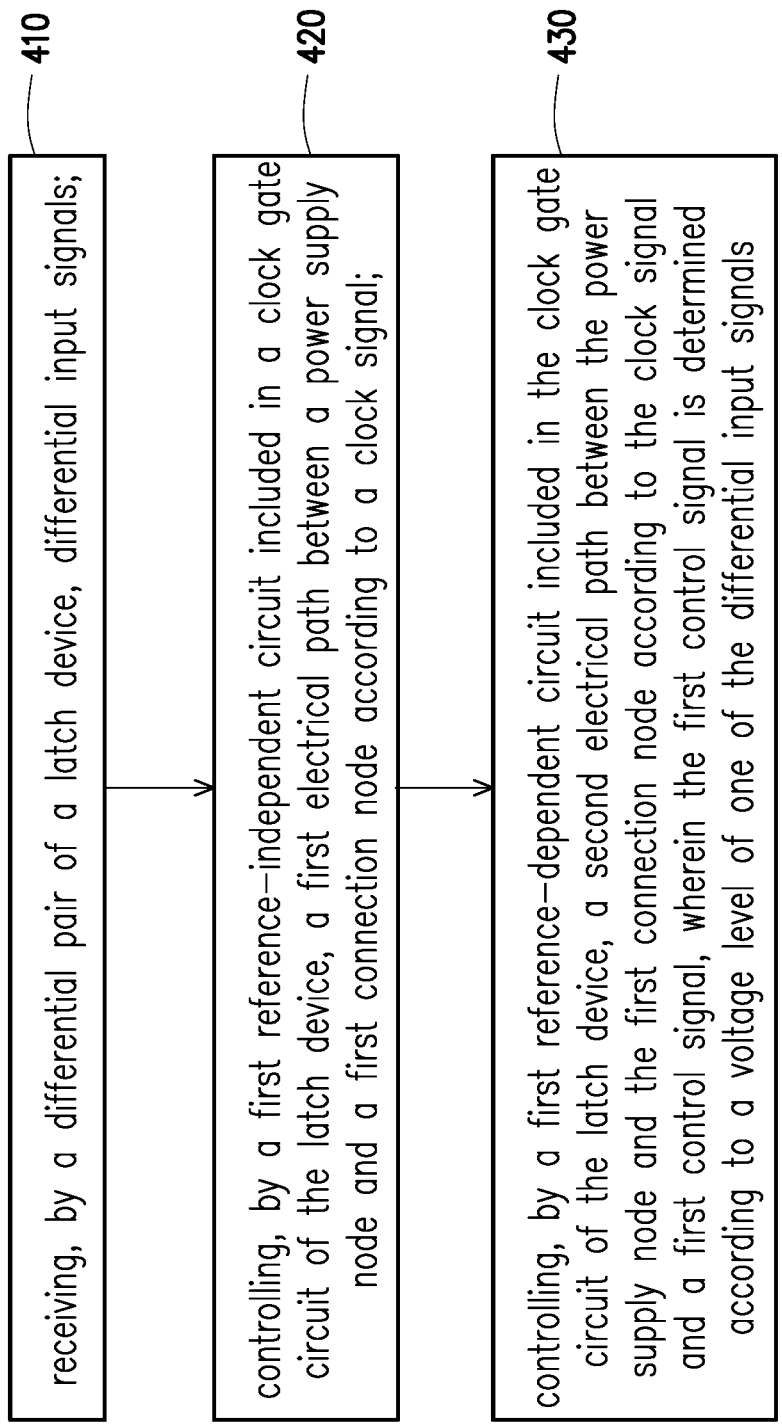
FIG. 4 illustrates a flowchart diagram of an operation method of a latch device in accordance with some embodiments.

FIG. 4 illustrates a flowchart diagram of an operation method of a latch device (i.e., latch device 100 in FIG. 1) in accordance with some embodiments. Referring to FIG. 1, FIG. 2 and FIG. 4, in block 410, the differential input signals INP and INN are received by the differential pair 150 of the latch device 100. In block 420, the first reference-independent circuit 112 of the clock gate circuit 110 is configured to control a first electrical path between the power supply node N0 and the first connection node N1 according to the clock signal CKF. In block 430, the reference-dependent circuit 114 in the clock gate circuit 110 is configured to control an electrical path between the power supply node N0 and the first connection node N1 according to the clock signal CKF and a first control signal S1, wherein the first control signal S1 is determined according to a voltage level of one of the differential input signals.

In the above embodiments, as each of the clock gate circuit 110 and the offset cancellation circuit 120 includes a reference-independent circuit and a reference-dependent circuit, the clock gate circuit 110 and the offset cancellation circuit 120 may adjust the effective conductive widths of the clock gate circuit 110 and the offset cancellation circuit 120 according to the voltage level of at least one of the input signals INP or INN. In this way, the latch device 100 may operate with a wide common-mode range of the input signals INP and INN. The input signals INP and INN may be differential input signals or may include a differential input signal and a reference signal. Accordingly, the latch device 100 may be applied to a wide range of applications. For example, the latch device 100 may be used in applications such as Double Data Rate (DDR) memory system, where the common-mode voltages of the differential input signals might vary significantly. The latch device 100 may also be used as a single-ended receiver that receives a single-ended input signal and a reference signal as input signals. In some embodiments, the latch device 100 is a differential cascode voltage switch (DCVS) latch.

Although the embodiment of the disclosure has been described in detail, the disclosure is not limited to a specific embodiment and various modifications and changes are possible within the scope of the disclosure disclosed in the claims.

What is claimed is:

1. A latch device, comprising:
a differential pair, receiving differential input signals;
a differential circuit, including a pair of cross-coupled inverters, performing a logic operation on the differential input signals; and
a clock gate circuit, coupled between a power supply node and a first connection node, supplying a supply voltage from the power supply node to the first connection node according to a clock signal, wherein the clock gate circuit includes:
a first reference-independent circuit, controlling a first electrical path between the power supply node and the first connection node according to the clock signal; and
a first reference-dependent circuit, controlling a second electrical path between the power supply node and the first connection node according to the clock signal and a first control signal, wherein the first control signal is determined according to a comparison of a voltage level of one of the differential input signals to a first threshold value.

2. The latch device of claim 1, wherein
the first reference-independent circuit include a first transistor that is coupled between the power supply node and the first connection node, wherein the first transistor is controlled by the clock signal, and
the first reference-dependent circuit includes a second transistor and a third transistor being coupled in series between the power supply node and the first connection node, wherein the second transistor is controlled by the clock signal, and the third transistor is controlled by the first control signal.

3. The latch device of claim 2, wherein
the first reference-dependent circuit is further configured to control a third electrical path between the power supply node and the first connection node according to the clock signal and a second control signal, wherein the second control signal is determined according to the voltage level of the one of the differential input signals, and
the first reference-dependent circuit further includes a fourth transistor and a fifth transistor being coupled in series between the power supply node and the first connection node, wherein the fourth transistor is controlled by the clock signal, and the fifth transistor is controlled by the second control signal.

4. The latch device of claim 3, wherein
the first control signal is configured to turn on the third transistor of the second circuit when the voltage level of the one of the differential input signals is above the first threshold value, and
the second control signal is configured to turn on the fifth transistor of the second circuit when the voltage level of the one of the differential input signals is above a second threshold value, wherein the second threshold value is greater than the first threshold value.

5. A latch device, comprising:
a differential pair, receiving differential input signals;
a differential circuit, including a pair of cross-coupled inverters, performing a logic operation on the differential input signals; and
an offset cancellation circuitry, including at least one first offset cancellation circuit and at least one second offset cancellation circuit, wherein the at least one first offset cancellation circuit is coupled between a first connection node and a second connection node, and the at least one second offset cancellation circuit is coupled between the first connection node and a third connection node,
wherein each of the at least one first offset cancellation circuit and the at least one second offset cancellation circuit comprises:

a first reference-independent circuit, controlling a first electrical path between the first connection node and one of the second connection node and the third connection node according to an offset control bit; and a first reference-dependent circuit, controlling a second electrical path between the first connection node and the one of the second connection node and the third connection node according to the offset control bit and a first control signal, wherein the first control signal is determined according to a comparison of a voltage level of one of the differential input signals to a first threshold value.

6. The latch device of claim 5, wherein
the first reference-independent circuit includes a first transistor that is coupled between the first connection node and the one of the second connection node and the third connection node, wherein the first transistor is controlled by the offset control bit, and
the first reference-dependent circuit includes a second transistor and a third transistor being coupled in series between the first connection node and the one of the second connection node and the third connection node, wherein the second transistor is controlled by the offset control bit, and the third transistor is controlled by the first control signal.

7. The latch device of claim 6, wherein
the first control signal is configured to turn on the third transistor when the voltage level of the one of the differential input signals is below the first threshold value.

8. The latch device of claim 7, wherein
the first reference-dependent circuit further includes a fourth transistor and a fifth transistor being coupled in series between the first connection node and the one of the second connection node and the third connection node, wherein the fourth transistor is controlled by the offset control bit, and the fifth transistor is controlled by the second control signal.

9. The latch device of claim 8, wherein
the second control signal is configured to turn on the fifth transistor when the voltage level of the one of the differential input signals is below the second threshold value.

10. The latch device of claim 5, wherein
the first reference-dependent circuit is further configured to control a third electrical path between the first connection node and the one of the second connection node and the third connection node according to the offset control bit and a second control signal, wherein the second control signal is determined according to the voltage level of the one of the of the differential input signals.

11. The latch device of claim 5, further comprising:
a clock gate circuit, coupled between a power supply node and the first connection node, supplying a supply voltage from the power supply node to the first connection node according to a clock signal, wherein the clock gate circuit includes:
  a second reference-independent circuit, controlling a third electrical path between the power supply node and the first connection node according to the clock signal; and
  a second reference-dependent circuit, controlling a fourth electrical path between the power supply node and the first connection node according to the clock signal and a third control signal, wherein the third control signal is determined according to the voltage level of the one of the differential input signals.

12. The latch device of claim 11, wherein
the second reference-independent circuit include a sixth transistor that is coupled between the power supply node and the first connection node, wherein the sixth transistor is controlled by the clock signal, and
the second reference-dependent circuit includes a seventh transistor and an eighth transistor being coupled in series between the power supply node and the first connection node, wherein the seventh transistor is controlled by the clock signal, and the eighth transistor is controlled by the third control signal.

13. The latch device of claim 11, wherein
the second reference-independent circuit of the clock gate circuit is further configured to control a fifth electrical path between the power supply node and the first connection node according to the clock signal and a fourth control signal, wherein the fourth control signal is determined according to the voltage level of the one of the differential input signals.

14. The latch device of claim 13, wherein the second reference-dependent circuit of the clock gate circuit further includes a ninth transistor and a tenth transistor being coupled in series between the power supply node and the first connection node, wherein the ninth transistor is controlled by the clock signal, and the tenth transistor is controlled by the fourth control signal.

15. The latch device of claim 13, wherein
the first control signal is an inverted signal of the third control signal, and
the second control signal is an inverted signal of the fourth control signal.

16. The latch device of claim 13, wherein
the third control signal is configured to turn on the eighth transistor of the fourth circuit when a voltage level of the one of the differential input signals is above the first threshold value, and
the fourth control signal is configured to turn on the tenth transistor of the fourth circuit when the voltage level of the one of the differential input signals is above a second threshold value, wherein the second threshold value is greater than the first threshold value.

17. An operation method of a latch device, comprising:
receiving, by a differential pair of the latch device, differential input signals;
controlling, by a first reference-independent circuit included in a clock gate circuit of the latch device, a first electrical path between a power supply node and a first connection node according to a clock signal; and
controlling, by a first reference-dependent circuit included in the clock gate circuit of the latch device, a second electrical path between the power supply node and the first connection node according to the clock signal and a first control signal, wherein the first control signal is determined according to a comparison of a voltage level of one of the differential input signals to a first threshold value.

18. The operation method of claim 17, further comprising:
controlling, by a second reference-independent circuit included in an offset cancellation circuit of the latch device, a third electrical path between the first connection node and a second connection node according to a clock signal; and
controlling, by a second reference-dependent circuit included in the offset cancellation circuit of the latch device, a fourth electrical path between the first connection node and a third connection node according to a clock signal and a second control signal, wherein the second control signal is determined according to the voltage level of the one of the differential input signals.

\* \* \* \* \*